US009454161B1

(12) United States Patent
Ura

(10) Patent No.: US 9,454,161 B1
(45) Date of Patent: Sep. 27, 2016

(54) SEMICONDUCTOR DEVICE AND ELECTRONIC APPARATUS

(71) Applicant: Synaptics Display Devices GK, Tokyo (JP)

(72) Inventor: Yoshinori Ura, Tokyo (JP)

(73) Assignee: Synaptics Japan GK, Tokyo (JP)

( * ) Notice: Subject to any disclaimer, the term of this patent is extended or adjusted under 35 U.S.C. 154(b) by 0 days.

(21) Appl. No.: 15/052,547

(22) Filed: Feb. 24, 2016

(30) Foreign Application Priority Data

Mar. 13, 2015 (JP) ................................ 2015-050552

(51) Int. Cl.
*G11C 8/08* (2006.01)
*G11C 8/10* (2006.01)
*G05F 1/10* (2006.01)
*G09G 3/36* (2006.01)

(52) U.S. Cl.
CPC ............... *G05F 1/10* (2013.01); *G09G 3/3648* (2013.01); *G09G 3/3696* (2013.01); *G09G 2310/0291* (2013.01); *G09G 2310/0294* (2013.01); *G09G 2330/02* (2013.01)

(58) Field of Classification Search
CPC .............. G11C 8/08; G11C 8/10; G11C 8/12
See application file for complete search history.

(56) References Cited

U.S. PATENT DOCUMENTS 5,289,425 A * 2/1994 Horiguchi ........ G01R 31/31715 327/540
5,694,364 A * 12/1997 Morishita ............. G11C 5/147 365/201
5,929,539 A * 7/1999 Kozaru .................. G05F 1/465 307/130
6,351,178 B1 * 2/2002 Ooishi .................. G11C 5/143 323/313
2003/0129960 A1 * 7/2003 Kato ...................... H04H 40/90 455/334
2005/0213380 A1 * 9/2005 Taniguchi ............ G06F 1/3209 365/185.11
2008/0001656 A1 * 1/2008 Takeuchi .............. G11C 5/147 327/544
2011/0199397 A1 8/2011 Ko et al.
2013/0194857 A1 * 8/2013 Miyamoto .......... G11C 11/4063 365/149
2013/0223175 A1 * 8/2013 Lee .......................... G05F 1/56 365/228
2014/0002438 A1 1/2014 Higashi et al.
2014/0298065 A1 10/2014 Sakamaki
2015/0036416 A1 * 2/2015 Kim ........................ G11C 5/14 365/149
2015/0187402 A1 * 7/2015 Chun ....................... G11C 8/08 365/230.02

* cited by examiner

*Primary Examiner* — Ricardo L Osorio
(74) *Attorney, Agent, or Firm* — Patterson + Sheridan LLP

(57) ABSTRACT

Detection circuits cause a power supply circuit to start an initialization sequence by detecting abnormal behavior where an external power supply voltage is cut off, the power supply circuit generating a first internal power supply voltage from a first external power supply voltage and generating a second internal power supply voltage from a second external power supply voltage higher than the first external power supply voltage in terms of an absolute value, and an auxiliary amplifier that makes up for a drop in the first internal power supply voltage, using the second external power supply voltage as an operation power supply after detecting the abnormal behavior of the first external power supply voltage. A sample and hold circuit of a reference voltage of the auxiliary amplifier is configured in a hold state after detecting the abnormal behavior of the first external power supply voltage.

20 Claims, 9 Drawing Sheets

SEMICONDUCTOR DEVICE AND ELECTRONIC APPARATUS

CROSS-REFERENCE TO RELATED APPLICATIONS

The Present application claims priority from Japanese application JP 2015-050552 filed on Mar. 13, 2015, the content of which is hereby incorporated by reference into this application.

BACKGROUND

The invention relates to a control technique for coping with undesired power supply abnormality in a semiconductor device or an electronic apparatus, and relates to, for example, a technique effective in a case of application to a liquid crystal display driver.

In case that an external power supply which is supplied to a drive-system semiconductor device such as a liquid crystal driver is cut off, the state of a driven device such as a liquid crystal display panel is required to be initialized until the semiconductor device is not able to operate. For example, in a case of a liquid crystal display driver, this is intended not to cause deterioration in characteristics or the like in liquid crystal display elements due to undesired charge information remaining in pixels of the liquid crystal display panel in case that an operation power supply is cut off. For this reason, an initialization process is performed which is called a display off-sequence process of discharging charge information of each pixel of the liquid crystal display panel, or the like. This process is, for example, a process of extracting held charges of each element by collectively selecting gate lines of the liquid crystal display panel and giving a predetermined potential to each source electrode, and the control thereof is performed by a logic circuit of a liquid crystal driver.

Normally, a liquid crystal driver receives a logic external power supply voltage from the outside and a drive power supply voltage having a level higher than that from an external power supply circuit. From such a relationship, it is possible to make it a start condition of a display off-sequence process that the drive external power supply voltage having a higher level is set to be at a predetermined level or lower. For example, in JP-A-2011-170349, the same process as the above is also performed.

Such a display off-sequence process is controlled by a logic circuit operating at a so-called logic voltage lower than a drive voltage. In JP-A-2014-010231, it has been considered that, even in case that the above response process is started on the basis of a drop in the voltage of a drive power supply, the response process may not be able to be completed due to a logic power supply dropping on the way or in advance. That is, the response process is started by detecting a drop in the voltage of the logic power supply. In JP-A-2014-202792, the response process is started in either case of a drop in the voltage of the drive power supply or a drop in the voltage of the logic power supply. In JP-A-2014-202792, it is considered that an operation power supply of a logic circuit is used for dropping the voltage of a drive power supply in case that the response process is started due to a drop in the voltage of the logic power supply.

SUMMARY

One embodiment of the present disclosure is a semiconductor device that includes a power supply circuit configured to generate a first internal power supply voltage using a first external power supply voltage and generate a second internal power supply voltage using a second external power supply voltage higher than the first external power supply voltage in terms of an absolute value. The semiconductor devices also includes an internal circuit configured to drive and control an external driven device, wherein the internal circuit is configured to use the first internal power supply voltage and the second internal power supply voltage as operation power supplies. The semiconductor devices also includes an initialization sequence circuit configured to use the first internal power supply voltage as an operation power supply and initialize a state of the external driven device. Furthermore, the power supply circuit includes a detection circuit configured to initialize the initialization sequence circuit after detecting at least one of: the first external power supply voltage is abnormally cut off and the second external power supply voltage is abnormally cut off. The power supply circuit also includes an auxiliary amplifier configured to make up for a drop in the first internal power supply voltage, using the second external power supply voltage as an operation power supply, after the first external power supply voltage is cut off abnormally. The power supply circuit also includes a sample and hold circuit of a reference voltage, connected to an input of the auxiliary amplifier, wherein the sample and hold circuit is configured to specify an output voltage of the auxiliary amplifier. Moreover, the sample and hold circuit is configured in a hold state after detecting the first external power supply voltage is cut off abnormally.

Another embodiment of the present disclosure is an electronic apparatus that includes a host device, a drive device which is controlled by the host device, a driven device which is driven by the drive device, and a battery power supply unit. Moreover, the drive device includes a power supply circuit configured to receive a first external power supply voltage and a second external power supply voltage higher than the first external power supply voltage in terms of an absolute value from the battery power supply unit, generate a first internal power supply voltage using a first external voltage, and generate a second internal power supply voltage using the second external power supply voltage and an internal circuit configured to drive and control the driven device, using the first internal power supply voltage and the second internal power supply voltage as operation power supplies. The drive device also includes an initialization sequence circuit configured to use the first internal power supply voltage as an operation power supply and initialize a state of the driven device. Moreover, the power supply circuit includes a detection circuit configured to initialize the initialization sequence circuit after detecting at least one of: the first external power supply voltage is cut off abnormally and the second external power supply voltage is cut off abnormally and an auxiliary amplifier configured to make up for a drop in the first internal power supply voltage, using the second external power supply voltage as an operation power supply, after the first external power supply voltage is cut off abnormally. The power supply circuit also includes a sample and hold circuit of a reference voltage, connected to an input of the auxiliary amplifier, wherein the sample and hold circuit is configured to specify an output voltage of the auxiliary amplifier. Further, the sample and hold circuit is configured in a hold state after detecting the first external power supply voltage is cut off abnormally.

Another embodiment of the present disclosure is a device that includes a power supply circuit configured to generate a first internal power supply voltage using a first external power supply voltage and generate a second internal power supply voltage using a second external power supply voltage higher than the first external power supply voltage in terms of an absolute value. The device also includes an internal circuit configured to drive and control an external driven device using the first internal power supply voltage and the second internal power supply voltage and an initialization sequence circuit configured to use the first internal power supply voltage as an operation power supply and initialize a state of the external driven device. Further, the power supply circuit includes a detection circuit configured to initialize the initialization sequence circuit after detecting at least one of: the first external power supply voltage is abnormally cut off and the second external power supply voltage is abnormally cut off. The power supply circuit also includes an auxiliary amplifier configured to make up for a drop in the first internal power supply voltage, using the second external power supply voltage as an operation power supply, after the first external power supply voltage is cut off abnormally and a sample and hold circuit of a reference voltage, connected to an input of the auxiliary amplifier. The sample and hold circuit is configured in a hold state after detecting the first external power supply voltage is cut off abnormally.

DETAILED DESCRIPTION

Figure 1:
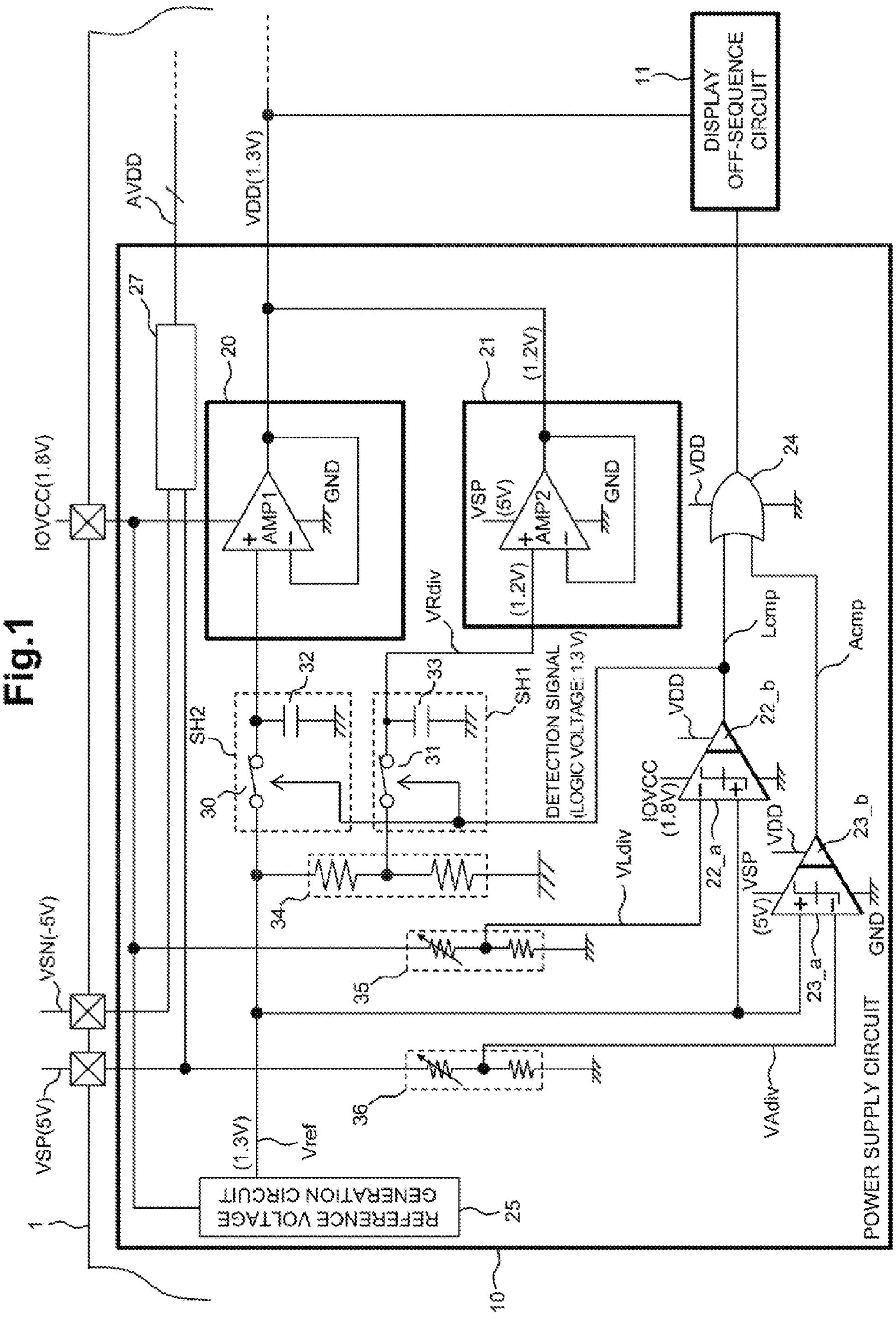
FIG. 1 is a block diagram illustrating a specific example of a power supply circuit held by a display driver which is an example of a semiconductor device according to the invention.

The inventor has examined a detection technique for starting an initialization process such as a display off-sequence process with respect to abnormality by which a power supply is cut off undesirably or unexpectedly. According to this, in the related art, the response process is started by detecting a drop in the voltage of an external power supply. In that case, even in case that an initialization process is started on the basis of a drop in the voltage of a drive power supply as in JP-A-2011-170349, a power supply of a logic circuit that controls the initialization process is not necessarily maintained. For example, in case that the battery of an electronic apparatus such as a battery-driven portable terminal is come off, power supply cutoff is caused due to the voltage of the logic power supply dropping undesirably together with the drive power supply. In this case, it is possible to perform a countermeasure to externally attach a large power supply stabilization capacitive element in order to mitigate a drop in the logic power supply, but an increase in the number of circuit elements, an increase in the size of a circuit and an increase in assembly man-hours are caused. The same is true of JP-A-2014-010231. In the case of JP-A-2014-202792, there is not necessarily a guarantee of the drive power supply being maintained at a required voltage, and a stabilization capacitive element is required to be externally attached likewise.

An object of the invention is to provide a semiconductor device capable of reliably completing control for the initialization of a driven device which is performed in case that an external power supply is cut off undesirably without being interrupted halfway due to power supply cutoff, and an electronic apparatus to which such a semiconductor device is applied.

The above and other objects and novel features of the invention will be made clearer from the description and the accompanying drawings of the present specification.

The following is a brief description of the summary of the representative embodiments of the invention disclosed in the present application. Meanwhile, reference numerals and signs within the drawings and the like which are written in parentheses in the present items are an example for making the content easier to understand.

[1] Initialization of Driven Device is Completed Even in Case that any of a Plurality of External Power Supplies Having Different Voltages are Cut Off in Advance A semiconductor device (1) according to the invention includes: a power supply circuit (10) that generates a first internal power supply voltage (VDD) on the basis of a first external power supply voltage (IOVCC), and generates a second internal power supply voltage (AVDD) on the basis of a second external power supply voltage (VSP) higher than the first external power supply voltage in terms of an absolute value; an internal circuit (13 to 19) that drives and controls an external driven device (2), using the first internal power supply voltage and the second internal power supply voltage as operation power supplies; and an initialization sequence circuit (11) that operates using the first internal power supply voltage as an operation power supply, and initializes a state of the driven device driven by the internal circuit through the internal circuit. The power supply circuit includes a detection circuit (22, 23) that causes the initialization sequence circuit to start the initialization even in case abnormal behavior where the first external power supply voltage is cut off or abnormal behavior where the second external power supply voltage is cut off is detected, an auxiliary amplifier (21) that makes up for a drop in the first internal power supply voltage, using the second external power supply voltage as an operation power supply, in case that the detection circuit detects the abnormality of the first external power supply voltage, and a sample and hold circuit (SH1) of a reference voltage (VRdiv), connected to an input of the auxiliary amplifier, for specifying an output voltage of the auxiliary amplifier. The sample and hold circuit is set in a hold state on the basis of abnormality detection of the first external power supply voltage performed by the detection circuit.

According to this, even in case that the circuit that generates the reference voltage is influenced by the first external power supply voltage being cut off, the reference voltage which is supplied to the auxiliary amplifier is held by the sample and hold circuit, and thus it is possible to obtain a margin for time until the attenuation. Furthermore, a voltage to be held is the reference voltage, and is not the power supply voltage itself to be cut off. Therefore, the held voltage is not attenuated instantaneously, and a capacitive element having a large capacitance value is not also required in the sample and hold capacitor. Therefore, not only in case that the second external power supply voltage having a high value is cut off in advance, but also in case that the first external power supply voltage having a value lower than that is cut off, it is possible to avoid a state where the operation power supply is interrupted on the way of the operation of initialization control of the initialization sequence circuit, and to easily and reliably perform control for initializing the driven device in case that the external power supply is cut off undesirably.

[2] Output Voltage of Auxiliary Amplifier is Lower than Output Voltage of Main Amplifier In item 1, the output voltage of the auxiliary amplifier is a voltage which is lower than an expected voltage value of the first internal power supply voltage by an undesired maximum drop voltage or higher and is higher than an operation guaranteed minimum voltage.

Thereby, in a normal state where the first external power supply voltage is not cut off, the auxiliary amplifier needs not perform an output drive operation substantially, and thus it is possible to prevent the second external power supply voltage from being used wastefully in order to generate the first internal power supply voltage. Further, it is possible to prevent the second external power supply voltage from being undesirably consumed by the auxiliary amplifier in a standby state of a circuit using the second internal power supply voltage, and to contribute to the reliability of a test operation.

[3] Reference Voltage is Set to Reference Voltage of Main Amplifier, and Divided Voltage of Reference Voltage is Set to Reference Voltage of Auxiliary Amplifier In item 2, the power supply circuit includes a reference voltage generation circuit (10) that generates a reference voltage (Vref) using the first external power supply voltage as an operation power supply, a voltage-dividing circuit (34) that divides the reference voltage generated in the reference voltage generation circuit, and a main amplifier (20) that generates the first internal power supply voltage using the first external power supply voltage as an operation power supply, the divided voltage (VRdiv) which is output from the voltage-dividing circuit is set to a reference voltage of the auxiliary amplifier, and the reference voltage is set to a reference potential of the main amplifier.

According to this, since the reference voltage which is relatively stable against a fluctuation in the first external power supply voltage is used in the reference voltage of the main amplifier, and the divided voltage of the reference voltage is used in the reference voltage of the auxiliary amplifier, an output voltage difference between the main amplifier and the auxiliary amplifier is easily formed, and thus it is possible to stably generate the first internal power supply voltage.

[4] Main Amplifier

In item 3, the main amplifier includes an operational amplifier (AMP1) that receives the reference voltage as a reference potential in one input terminal and receives a feedback voltage from an output thereof in the other input terminal.

According to this, it is possible to easily realize the main amplifier.

[5] Auxiliary Amplifier

In item 4, the auxiliary amplifier includes an operational amplifier (AMP2) that receives the divided voltage in one input terminal and receives a feedback voltage from the output thereof in the other input terminal.

According to this, it is possible to easily realize the auxiliary amplifier.

[6] Divided Voltage is Held by Capacitor in Response to Abnormality Detection of First External Power Supply Voltage In item 3, the semiconductor device further includes a first sample and hold circuit, as the sample and hold circuit, which includes a first capacitive element (33) coupled to an input terminal of the reference voltage of the auxiliary amplifier and a first switching element (31) capable of selectively supplying the divided voltage to a coupling node thereof, and the detection circuit changes the first switching element to an off-state by the abnormality detection of the first external power supply voltage.

Thereby, it is possible to easily realize the first sample and hold circuit.

[7] Divided Voltage is Held by Capacitor in Response to Abnormality Detection of Second External Power Supply Voltage In item 3, the power supply circuit includes a second sample and hold circuit including a second capacitive element (32) coupled to an input terminal of a reference voltage of the main amplifier and a second switching element (30) capable of selectively supplying the reference voltage to a coupling node thereof. The detection circuit changes the second switching element to an off-state by the abnormality detection of the first external power supply voltage.

Thereby, even in case that the circuit that generates the reference voltage is influenced by the first external power supply voltage being cut off, the reference voltage which is supplied to the main amplifier is held by the second sample and hold circuit, and thus it is possible to obtain a margin for time until the attenuation, and to realize a function of maintaining an output of the main amplifier to some extent. This function and the output function of the auxiliary amplifier can further increase the certainty of initialization process completion due to the initialization sequence circuit during the undesired cutoff of a power supply.

[8] Detection Circuit

In item 1, the detection circuit includes a first detection circuit (22) that detects the abnormality of the first external power supply voltage. The first detection circuit includes a first comparator (22_*a*) that inputs the reference voltage to one input terminal and inputs a first divided voltage of the first external power supply voltage to the other input terminal, using the first external power supply voltage as an operation power supply, and a first output circuit (22_*b*) that forms an output according to an output of the first comparator, using the first internal power supply voltage as an operation power supply. The first divided voltage before the first external power supply voltage is changed to the abnormality is a voltage higher than the reference voltage.

According to this, incase that the first external power supply voltage is changed to the abnormality, the reference voltage generation circuit is also influenced thereby, but a variation in the reference voltage due to this is smaller than a variation in the first external power supply voltage. Therefore, it is possible to reliably detect the abnormality of the first external power supply voltage by a magnitude relation between differential inputs of the first comparator being reversed on the way.

[9] Detection Circuit

In item 8, the detection circuit includes a second detection circuit (23) that detects the abnormality of the second external power supply voltage. The second detection circuit includes a second comparator (23_*a*) that inputs the reference voltage to one input terminal and inputs a second divided voltage of the second external power supply voltage to the other input terminal, using the second external power supply voltage as an operation power supply, and a second output circuit (23_*b*) that forms an output according to an output of the second comparator, using the first internal power supply voltage as an operation power supply. The second divided voltage before the second external power supply voltage is changed to the abnormality is a voltage higher than the reference voltage.

According to this, even in case that the reference voltage generation circuit is influenced by the second external power supply voltage being changed to the abnormality, a variation in the reference voltage due to this is smaller than a variation in the second external power supply voltage. Therefore, it is possible to reliably detect abnormal behavior of the second external power supply voltage by a magnitude relation between differential inputs of the second comparator being reversed on the way.

[10] Initialization of Driven Device is Completed Even in Case that any of a Plurality of External Power Supplies is Cut Off in Advance Due to Battery Dropout An electronic apparatus (5) according to the invention includes: a host device (3); a drive device (1) which is controlled by the host device; a driven device (2) which is driven by the drive device; and a battery power supply unit (4). The drive device includes a power supply circuit that receives a first external power supply voltage and a second external power supply voltage higher than the first external power supply voltage in terms of an absolute value from the battery power supply unit, generates a first internal power supply voltage on the basis of a first external voltage, and generates a second internal power supply voltage on the basis of the second external power supply voltage, an internal circuit that drives and controls the driven device, using the first internal power supply voltage and the second internal power supply voltage as operation power supplies, and an initialization sequence circuit that operates using the first internal power supply voltage as an operation power supply, and initializes a state of the driven device driven by the internal circuit through the internal circuit. The power supply circuit includes a detection circuit that causes the initialization sequence circuit to start the initialization even in case that an abnormality where the first external power supply voltage is cut off or an abnormality where the second external power supply voltage is cut off is detected, an auxiliary amplifier that makes up for a drop in the first internal power supply voltage, using the second external power supply voltage as an operation power supply, in case that the detection circuit detects abnormal behavior of the first external power supply voltage, and a sample and hold circuit of a reference voltage, connected to an input of the auxiliary amplifier, for specifying an output voltage of the auxiliary amplifier. The sample and hold circuit is set to be in a hold state on the basis of abnormality detection of the first external power supply voltage performed by the detection circuit.

According to this, even in case that the circuit that generates the reference voltage is influenced by the first external power supply voltage being cut off, the reference voltage which is supplied to the auxiliary amplifier is held by the sample and hold circuit, and thus it is possible to obtain a margin for time until the attenuation. Furthermore, a voltage to be held is the reference voltage, and is not the power supply voltage itself to be cut off. Therefore, the held voltage is not attenuated instantaneously, and a capacitive element having a large capacitance value is not also required in the sample and hold capacitor. Therefore, not only in case that the second external power supply voltage having a high value is cut off in advance, but also in case that the first external power supply voltage having a value lower than that is cut off, it is possible to avoid a state where the operation power supply is interrupted on the way of the operation of initialization control of the initialization sequence circuit, and to easily and reliably cope with the undesired cutoff of a power supply. Thus, it is possible to complete the initialization of the driven device even in case that any of a plurality of external power supplies is cut off in advance due to battery dropout of the battery power supply unit.

[11] Output Voltage of Auxiliary Amplifier is Lower than Output Voltage of Main Amplifier In item 10, the output voltage of the auxiliary amplifier is a voltage which is lower than an expected voltage value of the first internal power supply voltage by an undesired maximum drop voltage or higher and is higher than an operation guaranteed minimum voltage.

According to this, the same operational effect as that in item 2 is exhibited.

[12] Reference Voltage is Set to Reference Voltage of Main Amplifier, and Divided Voltage of Reference Voltage is Set to Reference Voltage of Auxiliary Amplifier In item 11, the power supply circuit includes a reference voltage generation circuit that generates a reference voltage using the first external power supply voltage as an operation power supply, a voltage-dividing circuit that divides the reference voltage generated in the reference voltage generation circuit, and a main amplifier that generates the first internal power supply voltage using the first external power supply voltage as an operation power supply. The divided voltage which is output from the voltage-dividing circuit is set to a reference voltage of the auxiliary amplifier, and the reference voltage is set to a reference potential of the main amplifier.

According to this, the same operational effect as that in item 3 is exhibited.

[13] Divided Voltage is Held by Capacitor in Response to Abnormality Detection of First External Power Supply Voltage In item 12, the electronic apparatus further includes a first sample and hold circuit, as the sample and hold circuit, which includes a first capacitive element coupled to an input terminal of the reference voltage of the auxiliary amplifier and a first switching element capable of selectively supplying the divided voltage to a coupling node thereof, and the detection circuit changes the first switching element to an off-state by the abnormality detection of the first external power supply voltage.

According to this, the same operational effect as that in item 6 is exhibited.

[14] Divided Voltage is Held by Capacitor in Response to Abnormality Detection of Second External Power Supply Voltage In item 12, the power supply circuit includes a second sample and hold circuit including a second capacitive element coupled to an input terminal of a reference voltage of the main amplifier and a second switching element capable of selectively supplying the reference voltage to a coupling node thereof, and the detection circuit changes the second switching element to an off-state by the abnormality detection of the first external power supply voltage.

According to this, the same operational effect as that in item 7 is exhibited.

[15] Detection Circuit

In item 10, the detection circuit includes a first detection circuit that detects the abnormality of the first external power supply voltage. The first detection circuit includes a first comparator that inputs the reference voltage to one input terminal and inputs a first divided voltage of the first external power supply voltage to the other input terminal, using the first external power supply voltage as an operation power supply, and a first output circuit that forms an output according to an output of the first comparator, using the first internal power supply voltage as an operation power supply. The first divided voltage before the first external power supply voltage is changed to the abnormality is a voltage higher than the reference voltage.

According to this, the same operational effect as that in item 8 is exhibited.

[16] Detection Circuit

In item 15, the detection circuit includes a second detection circuit that detects the abnormality of the second external power supply voltage. The second detection circuit includes a second comparator that inputs the reference voltage to one input terminal and inputs a second divided voltage of the second external power supply voltage to the other input terminal, using the second external power supply voltage as an operation power supply, and a second output circuit that forms an output according to an output of the second comparator, using the first internal power supply voltage as an operation power supply. The second divided voltage before the second external power supply voltage is changed to the abnormality is a voltage higher than the reference voltage.

According to this, the same operational effect as that in item 9 is exhibited.

[17] Driven Device; Display Panel

In item 10, the driven device is a display panel in which a plurality of display elements are disposed in a matrix, and the initialization sequence circuit initializes signals which are held by the display elements of the display panel.

Thereby, even in case that the external power supply is cut off undesirably, undesired signals do not remain in the display elements, and thus an undesired residual image or a deterioration in the characteristics of the display elements is not caused.

[18] Charge Extraction of Display Element of Liquid Crystal Display Panel

In item 17, the display panel is a liquid crystal display panel, and the initialization sequence circuit extracts charges which are held by the display elements of the liquid crystal display panel to initialize the signals which are held by the display elements.

Thereby, even in case that the external power supply is cut off undesirably, undesired charges do not remain in the liquid crystal display panel, and thus a deterioration in the characteristics of the liquid crystal display elements or burn-in of an image is not caused.

The following is a brief description of an effect obtained by the representative embodiments of the invention disclosed in the present application.

That is, it is possible to reliably complete control of the initialization of the driven device which is performed in case that the external power supply is cut off undesirably without being interrupted halfway due to power supply cutoff.

Figure 2:
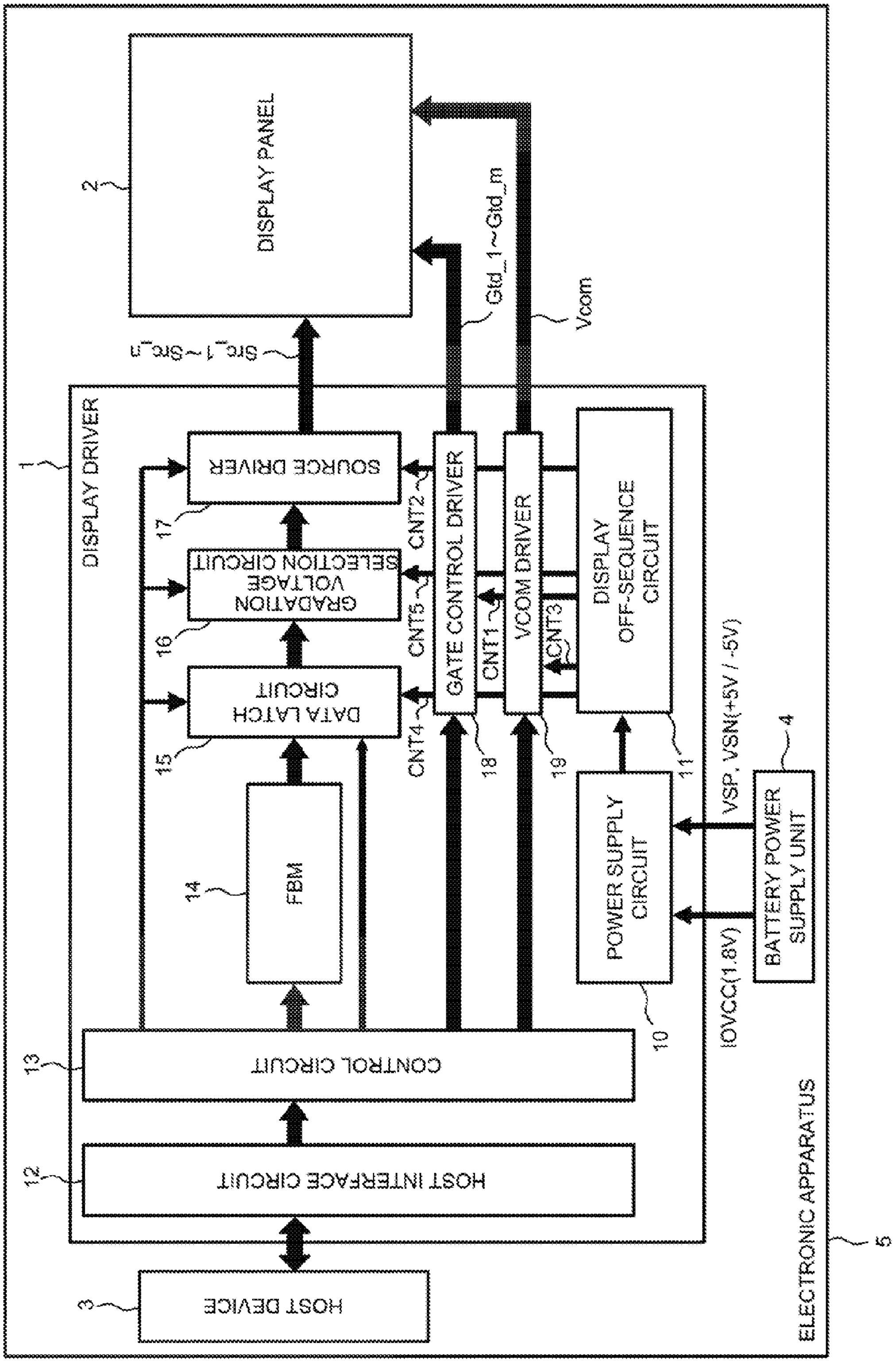
FIG. 2 is a block diagram illustrating a specific example of the display driver which is an example of the semiconductor device according to the invention and an electronic apparatus using the display driver.

FIG. 2 illustrates a display driver and an electronic apparatus using the display driver as an example of a semiconductor device according to the invention. A display driver 1 shown in the drawing, not particularly limited, is formed in one semiconductor substrate such as a single crystal silicon together with other appropriate circuit blocks, as necessary, by a CMOS integrated circuit manufacturing technique.

In FIG. 2, an electronic apparatus 5 includes a host device 3, the display driver 1 as a drive device which is controlled by the host device 3, a display panel 2 as a driven device to be driven for display by the display driver 1, and a battery power supply unit 4. The battery power supply unit 4 supplies an operation power supply voltage to each unit of the electronic apparatus 5. Here, an external logic power supply voltage IOVCC and external analog power supply voltages VSP and VSN are typically illustrated as external power supply voltages which are supplied to the display driver 1. In case that the electronic apparatus 5 is a portable communication terminal, the host device 3 is configured to include a communication unit capable of being connected to a portable communication network, a WiFi communication network or the like, a protocol processor that performs communication protocol processing using the communication unit, an application processor that performs control of the protocol processor or various data processing control, and peripheral devices such as an auxiliary storage device or other external interface circuits. The specific configuration of the host device 3 is not limited thereto, and can be variously changed in accordance with functions capable of realized by the electronic apparatus 5.

Figure 3:
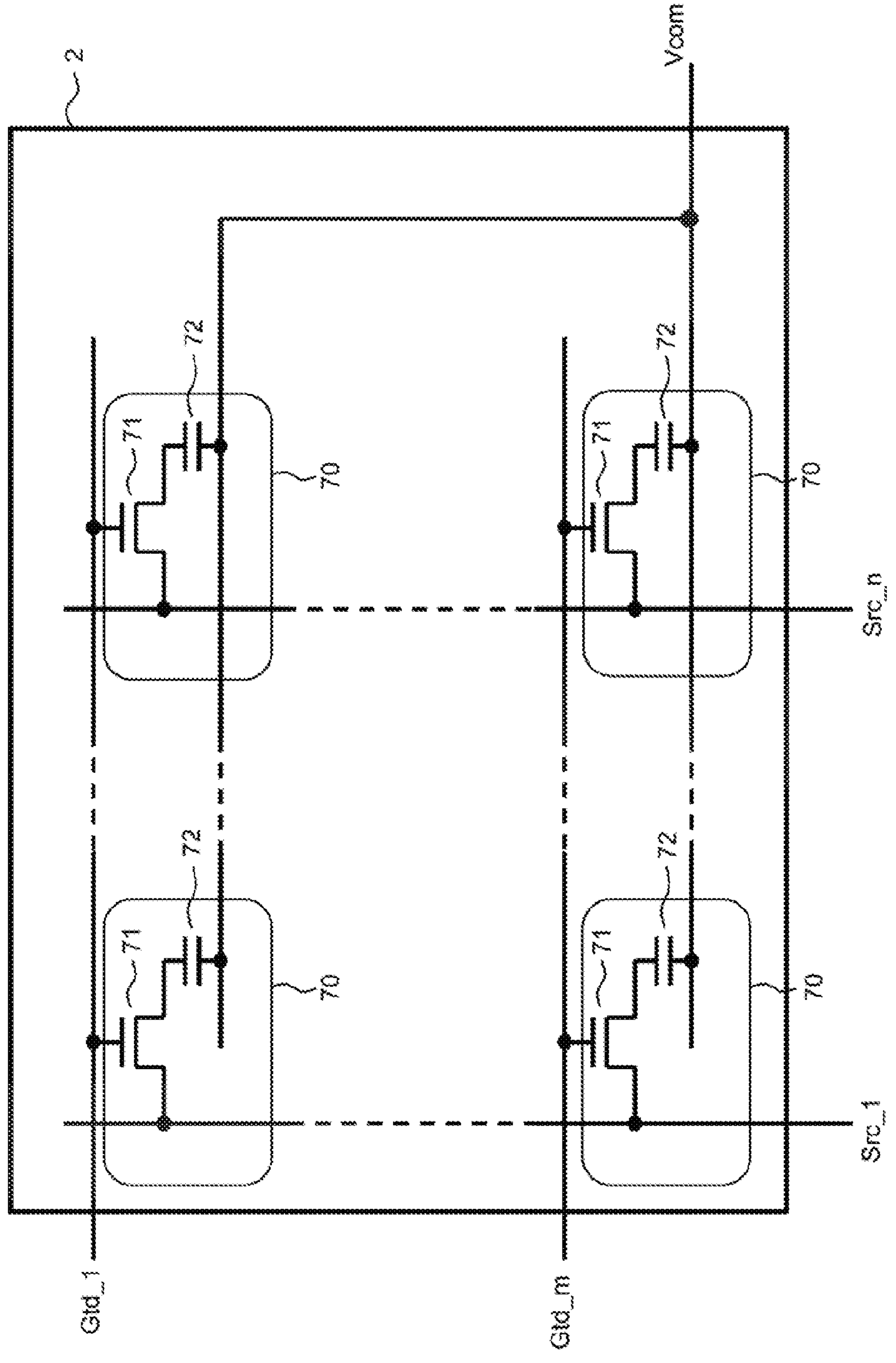
FIG. 3 is a circuit diagram illustrating a schematic circuit configuration of a display panel.

Although not particularly limited, in FIG. 2, a liquid crystal display panel is used as the display panel 2. As illustrated in FIG. 3, the display panel 2 is configured such that a plurality of pixels 70 are disposed on a glass substrate in a matrix, and that each of the pixels 70 includes a thin-film transistor 71 and a liquid crystal element 72 which are connected in series to each other. A common potential Vcom is given to the liquid crystal element 72 of each pixel. The selection terminal of the thin-film transistor 71 is connected to corresponding gate electrodes Gtd_1 to Gtd_m, and the signal terminal of the thin-film transistor 71 is connected to corresponding source electrodes Src_1 to Src_n which are disposed in a direction intersecting the gate electrodes Gtd_1 to Gtd_m. The line of each pixel of the gate electrodes Gtd_1 to Gtd_m serves as a display line, the display line is selected (scanning of the display line) by the thin-film transistor 71 of the pixel 70 being turned on in units of display lines, and a gradation voltage is applied to the liquid crystal element 72 from the source electrodes Src_1 to Src_n for each selection period (horizontal display period) of the display line. By the thin-film transistor 71 being turned off, the applied gradation voltage is held by a capacitive component of the liquid crystal element 72 until being selected next, and maintains a shut state of the liquid crystal element 72.

In FIG. 2, the display driver 1 includes a host interface circuit 12 that inputs display data from the host device 3 and inputs and outputs control data, and a control unit 13 that processes the display data and the control data which are input to the host interface circuit 12. The host interface circuit 12 has, as an input interface function of the image data, for example, an operating mode based on a video mode (also simply referred to as a video mode) of a mobile industry processor interface (MIPI)-display serial interface (DSI) for inputting the display data in synchronization with a display timing, and an operating mode based on an MIPI command mode (also simply referred to as a command mode) for inputting the display data in asynchronization with a display timing. As the interface function of control data, for example, an interface function based on an MIPI, a mobile display digital interface (MDDI) or the like is included.

The control circuit 13 decodes input control data to determine an internal operating mode, and performs display drive control in synchronization with a display timing signal which is supplied from the host device 3 or a display timing signal which is generated inside. Internal circuits which are used in drive control include a frame buffer memory (FBM) 14, a data latch circuit 15, a gradation voltage selection circuit 16, a source driver 17, a gate control driver 18, and a VCOM driver 19.

The display data which is input in the video mode is configured such that a display frame is specified by vertical synchronizing signals which are input together, and that a horizontal synchronous period is specified by horizontal synchronizing signals which are input together. With respect to the display data which is input in the video mode, the control circuit 13 is configured such that the display data is latched by the data latch circuit 15 in units of display lines while recognizing the display frame and the horizontal synchronous period in accordance with the vertical synchronizing signals and the horizontal synchronizing signals which are input together, a gradation voltage is selected by the gradation voltage selection circuit 16 on the basis of data in units of the latched display lines, and that the source electrodes Src_1 to Src_n are driven by the selected gradation voltage being received by the source driver 17. The gate control driver 18 sequentially selects gate electrodes Gtdn_1 to Gtd_m in units of horizontal synchronous periods. The common potential Vcom is output by the VCOM driver 19.

The display data which is input in the command mode is temporarily stored in the frame buffer memory 14, and the stored display data is read out in units of display lines to the data latch circuit 15 for each horizontal synchronous period based on the horizontal synchronizing signals generated inside of the control circuit 13. A gradation voltage is selected by the gradation voltage selection circuit 16 on the basis of data in units of latched display lines, and the source electrodes Src_1 to Src_n are driven by the selected gradation voltage being received by a source driver 33. The gate control driver 18 sequentially selects gate electrodes Gtdn_1 to Gtdn_m in units of horizontal synchronous periods. The common potential Vcom is output by the VCOM driver 19.

The display driver 1 is configured such that a power supply circuit 10 receives external logic power supply voltage IOVCC and the external analog power supply voltages VSP and VSN which are output from the battery power supply 4 and generates an internal power supply voltage, to thereby supply the generated voltage to each unit.

In normal power supply cutoff performed by a power supply switch (not shown) or the like which is provided in the electronic apparatus 5, a display off-sequence of discharging charges of all the pixels before a power supply is set to have an operation guarantee voltage or lower is performed by a display off-sequence circuit 11. A process of discharging pixel charges in the display off-sequence is an example of a process of initializing the state of a driven device represented by the display panel 2 which is driven by a drive device represented by the display driver 1, and the display off-sequence circuit 11 is an example of an initialization circuit that performs the initialization of such a meaning. The reason for discharging pixel charges through the display off-sequence during the power supply cutoff is to prevent a case from occurring in which due to undesired charge information remaining in the pixel 70, a display speckle is caused, or burn-in and characteristic deterioration are caused in the pixel 70. Meanwhile, the process of discharging charges of all the pixels is an example of a process of initializing the state of the display panel driven by the display driver 1.

Some specific examples of the display off-sequence which is performed in the display off-sequence circuit 11 will be described below. A first control aspect is control of causing the gate control driver 18 to select all the gate electrodes Gtd_1 to Gtd_m (all the display lines) through a control signal CNT1, causing the source driver 17 to supply a ground potential to all the source electrodes Src_1 to Src_n through a control signal CNT2, and causing the VCOM driver 19 to set the common potential Vcom to the ground potential through a control signal CNT3. Thereby, charge information of all the pixels 70 of the display panel 2 is discharged. A second control aspect is to cause the gate control driver 18 to select all the gate electrodes Gtd_1 to Gtd_m (all the display lines) through the control signal CNT1, and to cause a data latch circuit 31 to latch black data through a control signal CNT4. A third control aspect is to cause the gate control driver 18 to select all the gate electrodes Gtd_1 to Gtd_m (all the display lines) through the control signal CNT1, and to cause the gradation voltage selection circuit 16 to select a black gradation voltage through a control signal CNT5. All the pixels 70 of the display panel 2 display black data corresponding to a substantial discharge state in accordance with the second and third aspects.

In case that the power supply cutoff of the electronic apparatus 5 is normal, a problem is not caused in the display off-sequence. Even in case that the external power supply voltage is cut off undesirably as in a case of the dropout of a battery in the battery power supply unit 4, the operation guarantee voltage should be capable of being maintained until the completion of the display off-sequence. Otherwise, as a result of causing abnormality in the selection of the display line, the selection of the gradation voltage, or the like, undesired charge information remains in the pixel 70. Thereby, a display speckle may be caused, and burn-in or characteristic deterioration is caused in the pixel 70. The power supply circuit 10 has a function for coping with such undesired power supply cutoff. Hereinafter, the function will be described in detail.

FIG. 1 illustrates a specific example of the power supply circuit 10 held by the display driver 1. The power supply circuit 10 generates an internal logic power supply voltage VDD which is an example of a first internal power supply voltage on the basis of the external logic power supply voltage IOVCC which is an example of a first external power supply voltage, and generates an internal analog power supply voltage AVDD which is an example of a second internal power supply voltage on the basis of the external analog power supply voltages VSP and VSN which are an example of a second external power supply voltage higher than the external logic power supply voltage IOVCC in terms of an absolute value. The external logic power supply voltage IOVCC is, for example, 1.8 V, and the external analog power supply voltages VSP and VSN are, for example, 5 V and −5 V. The internal logic power supply voltage VDD is, for example, 1.3 V. The internal analog power supply voltage AVDD is a general term of a plurality of gradation voltages which are used for driving the source electrodes Src_1 to Src_n.

In FIG. 1, 27 refers to a circuit that generates the internal analog power supply voltage AVDD on the basis of the external analog power supply voltages VSP and VSN, is constituted by amplifier, a resistive voltage-dividing circuit and the like, although not particularly limited, and includes a so-called gradation voltage generation circuit.

The power supply circuit 10 includes an auxiliary amplifier 21 in addition to a main amplifier 20 which is used for generating the internal logic power supply voltage VDD. In addition, the power supply circuit 10 includes a detection circuit 22 (22_*a*, 22_*b*) for a logic power supply, a detection circuit 23 (23_*a*, 23_*b*) for an analog power supply, and an OR gate 24, as detection circuits that cause the display off-sequence circuit 11 to start the display off-sequence even in case that an abnormality where the external logic power supply voltage IOVCC is cut off (hereinafter, also simply denoted by external logic power supply abnormality) or an abnormality where the external analog power supply voltage VSP is cut off (hereinafter, also simply denoted by external analog power supply abnormality) is detected.

The power supply circuit 10 includes a reference voltage generation circuit 25 that generates a reference voltage Vref which is used as a reference of various reference voltages. The reference voltage generation circuit 25 uses the external logic power supply voltage IOVCC as an operation power supply, to output the reference voltage Vref by amplifying a fixed voltage using, for example, a band gap of silicon through an amplifier. Although not particularly limited, the reference voltage Vref is set to 1.3 V herein.

The detection circuit 22 for a logic power supply uses the external logic power supply voltage IOVCC as an operation power supply, to detect the external analog power supply abnormality depending on whether a divided voltage VLdiv obtained by dividing the external logic power supply voltage IOVCC using the resistive voltage-dividing circuit 35 is set to the reference voltage Vref or lower. The resistive voltage-dividing circuit 35 has a resistance division ratio at which the divided voltage VLdiv in case that a voltage drop considered as the external logic power supply abnormality is generated in the external logic power supply voltage IOVCC is set to 1.3 V or lower. In case that the divided voltage VLdiv is set to the reference voltage Vref or lower, the detection circuit 22 for a logic power supply reverses a detection signal Lcmp to a high level and gives notice of the generation of the external logic power supply abnormality. The detection circuit 22 for a logic power supply is constituted by a hysteresis comparator 22_*a* for a logic power supply and an output circuit 22_*b*.

Figure 4:
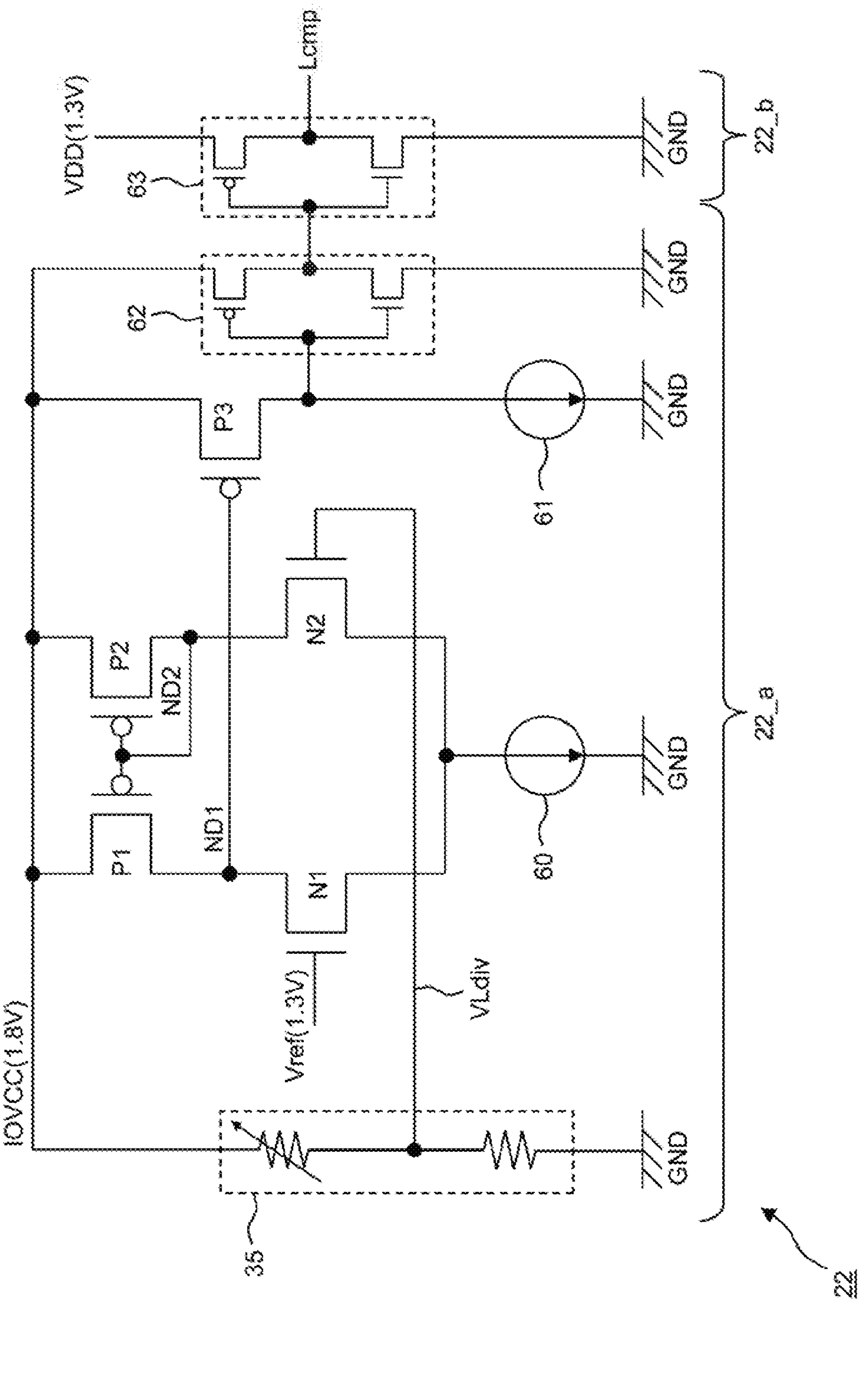
FIG. 4 is a circuit diagram illustrating a first detection circuit that detects abnormality by which a first external power supply voltage is cut off.

For example, as illustrated in FIG. 4, the hysteresis comparator 22_*a* for a logic power supply includes a differential amplifier in which a current mirror load of P-channel type MOS transistors P1 and P2 is connected to a differential input pair of N-channel type MOS transistors N1 and N2 connected to a current source 60. A p-channel type MOS transistor P3 receiving an output node ND1 in its gate and a source follower of a current source 61 are provided, and the input terminal of a CMOS inverter 62 is coupled to the drain of the MOS transistor P3. The reference voltage Vref is supplied to the gate of the MOS transistor N1, and the divided voltage VLdiv generated in the resistive voltage-dividing circuit 35 is supplied to the gate of the MOS transistor N2. The operation power supply of the hysteresis comparator 22_*a* for a logic power supply is the external logic power supply voltage IOVCC. At the output stage, the output circuit 22_*b* is constituted by a CMOS inverter 63 that outputs the detection signal Lcmp using an output amplitude as the internal logic power supply voltage VDD.

Incase that the external logic power supply abnormality is not generated, in FIG. 4, the divided voltage VLdiv becomes higher than the reference voltage Vref. In this case, the MOS transistor N2 receiving the divided voltage VLdiv within the differential input pair in its gate is turned on, and the MOS transistor N1 receiving the reference voltage Vref is turned off, which leads to a stable result. In this case, a node ND2 is set to be at a low level and the MOS transistors P1 and P2 are set to be in an on-state. Therefore, the node N1 is set to be at a high level, the transistor P3 is turned off, and the detection signal Lcmt is set to be at a low level.

Figure 6:
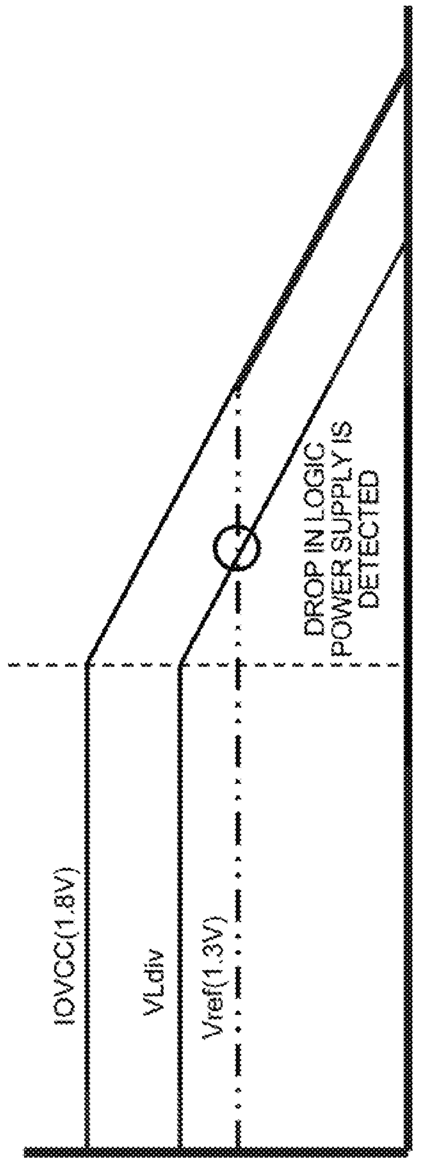
FIG. 6 is a diagram illustrating an operation of the first detection circuit.

In case that the external logic power supply IOVCC drops, as illustrated in FIG. 6, the reference voltage Vref has a level drop rate slower than that of the divided voltage VLdiv, in terms of the function of the reference voltage generation circuit 10. Thus, in case that the external logic power supply abnormality is generated, the divided voltage VLdiv falls below the reference voltage Vref, the MOS transistor N2 receiving the divided voltage VLdiv in its gate is turned off, and the MOS transistor N1 receiving the reference voltage Vref is turned on, which leads to a stable result. In this case, the node ND1 is set to be at a low level, the transistor P3 is turned on, and the detection signal Lcmt is set to be at a high level. Thereby, it is possible to reliably detect the external logic power supply abnormality.

The detection circuit 23 for an analog power supply uses the external analog power supply voltage VSP as an operation power supply, to detect the external analog power supply abnormality depending on whether the divided voltage VAdiv obtained by dividing the external analog power supply voltage VSP using a resistive voltage-dividing circuit 36 is set to the reference voltage Vref or lower. The resistive voltage-dividing circuit 36 has a resistance division ratio at which the divided voltage VAdiv in case that a voltage drop considered as the external analog power supply abnormality is generated in the external analog power supply voltage VSP is set to 1.3 V or lower. In case that the divided voltage VAdiv is set to the reference voltage Vref or lower, the detection signal Acmp is reversed to a high level and the generation of the external analog power supply abnormality is given notice of the abnormality. The detection circuit 23 for an analog power supply is constituted by a hysteresis comparator 23_*a* for an analog power supply and an output circuit 23_*b*.

Figure 5:
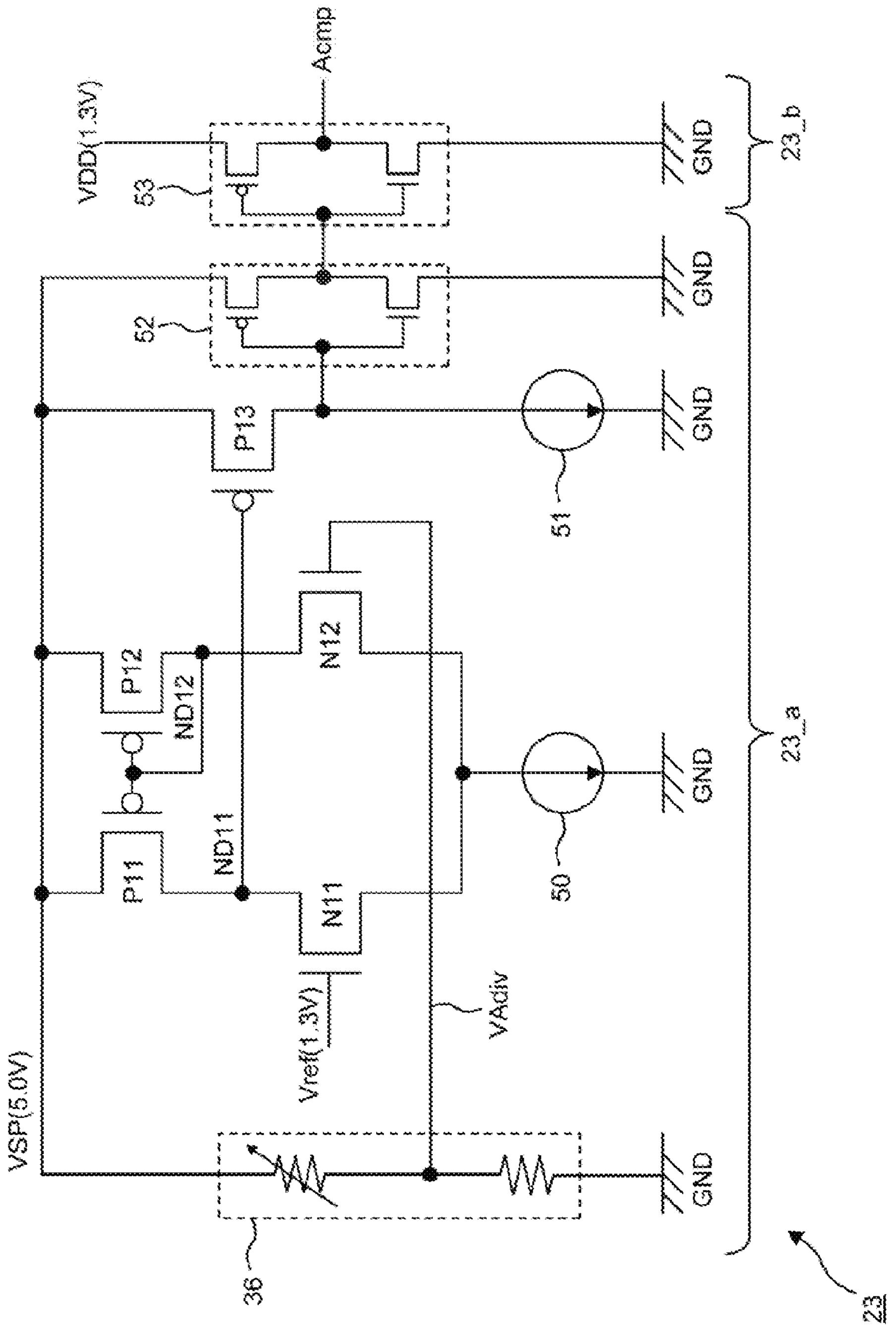
FIG. 5 is a circuit diagram illustrating a second detection circuit that detects abnormality by which a second external power supply voltage is cut off.

For example, as illustrated in FIG. 5, the hysteresis comparator 23_*a* for an analog power supply includes a differential amplifier in which a current mirror load of P-channel type MOS transistors P11 and P12 is connected to a differential input pair of N-channel type MOS transistors N11 and N12 connected to a current source 50. A p-channel type MOS transistor P13 receiving an output node ND11 in its gate and a source follower of a current source 51 are provided, and the input terminal of a CMOS inverter 52 is coupled to the drain of the MOS transistor P13. The reference voltage Vref is supplied to the gate of the MOS transistor N11, and the divided voltage VAdiv generated in the resistive voltage-dividing circuit 36 is supplied to the gate of the MOS transistor N12. The operation power supply of the hysteresis comparator 23_*a* for an analog power supply is the external analog power supply voltage VSP. At the output stage, the output circuit 23_*b* is constituted by a CMOS inverter 53 that outputs the detection signal Acmp using an output amplitude as the internal logic power supply voltage VDD.

In case that the external analog power supply abnormality is not generated, in FIG. 5, the divided voltage VAdiv becomes higher than the reference voltage Vref. In this case, the MOS transistor N12 receiving the divided voltage VAdiv within the differential input pair in its gate is turned on, and the MOS transistor N11 receiving the reference voltage Vref is turned off, which leads to a stable result. In this case, a node ND12 is set to be at a low level and the MOS transistors P11 and P12 are set to be in an on-state. Therefore, the node N11 is set to be at a high level, the transistor P13 is turned off, and a detection signal Acmt is set to be at a low level.

Even in case that the external logic power supply voltage IOVCC drops along with a drop in the external analog power supply voltage VSP, similarly to FIG. 6, the reference voltage Vref has a level drop rate slower than that of the divided voltage VAdiv, in terms of the function of the reference voltage generation circuit 10. Thus, in case that the external analog power supply abnormality is generated, the divided voltage VAdiv falls below the reference voltage Vref, the MOS transistor N12 receiving the divided voltage VAdiv in its gate is turned off, and the MOS transistor N11 receiving the reference voltage Vref is turned on, which leads to a stable result. In this case, the node ND11 is set to be at a low level, the transistor P13 is turned on, and the detection signal Acmp is set to be at a high level. Thereby, it is possible to reliably detect the external analog power supply abnormality.

The main amplifier 20 includes an operational amplifier AMP1 that generates an internal power supply voltage VDD using the external logic power supply voltage IOVCC as an operation power supply, receives, for example, the reference voltage Vref, as a reference potential, in its non-inverting input terminal (+), and receives a feedback voltage from the output in the other inverting input terminal (−). Here, the reference voltage Vref is set to, for example, 1.3 V, and thus the main amplifier 20 that outputs an internal power supply voltage VDD of 1.3 V is constituted by a voltage follower.

The auxiliary amplifier 21 operates using the external analog power supply voltage VSP as an operation power supply, and performs an amplification operation for making up for a drop in the internal logic power supply voltage VDD in case that the comparator 22 for a logic power supply detects the abnormality of the external logic power supply voltage IOVCC. For example, the auxiliary amplifier includes an operational amplifier AMP2 that receives a divided voltage VRdiv obtained by dividing the reference voltage Vref using a resistive voltage-dividing circuit 34, as a reference voltage VRdiv, in its non-inverting input terminal (+), and receives a feedback voltage from the output in its inverting input terminal (−). For, example, here, the auxiliary amplifier 21 is constituted by a voltage follower in which the reference voltage VRdiv is set to 1.2 V and the output voltage is set to 1.2 V. The output voltage of the auxiliary amplifier 21 is one voltage among the voltages which are lower than an expected voltage value of 1.3 V of the internal logic power supply voltage VDD by an undesired maximum drop voltage or higher and are higher than an operation guaranteed minimum voltage, and is set to a relatively low voltage, particularly, among them. This is because the auxiliary amplifier 21 needs not be brought into substantial output drive operation in a normal state where the external logic power supply voltage IOVCC is not cut off, and the external analog power supply voltage VSP is prevented from being used wastefully in order to generate the internal logic power supply voltage. Furthermore, it is possible to previously prevent the external analog power supply voltage VSP from being undesirably consumed by the auxiliary amplifier 21 in a standby state of a circuit using the internal analog power supply voltage AVDD, and to contribute to the reliability of a test operation.

A sample and hold circuit SH1 of the reference voltage VRdiv is connected to the non-inverting input terminal of the auxiliary amplifier 21. Similarly, a sample and hold circuit SH2 of the reference voltage Vref is connected to the non-inverting input terminal of the main amplifier 20. The sample and hold circuits SH1 and SH2 are set to be in a sampling state of the reference voltage which is input, until the logic power supply abnormality is detected (Lcmp=low level) by the comparator 22 for a logic power supply, and are set to be in a hold state of the reference voltage which is sampled, incase that the external logic power supply abnormality is once detected (detection signal Lcmp=high level).

For example, the sample and hold circuit SH1 includes a first capacitive element 33 coupled to the input terminal (non-inverting input terminal) of the reference voltage VRdiv of the auxiliary amplifier 21, and a first switching element 31 capable of selectively supplying the divided voltage VRdiv to the coupling node. The first switching element 31 is changed to an off-state by the logic power supply abnormality being detected by the comparator 22 for a logic power supply and by the detection signal Lcmp being set to be at a high level. In case that the detection signal Lcmp is set to be at a high level, the first switching element 31 maintains an on-state.

For example, the sample and hold circuit SH2 includes a second capacitive element 32 coupled to the input terminal (non-inverting input terminal) of the reference voltage Vref of the main amplifier 20, and a second switching element 30 capable of selectively supplying the divided voltage Vref to the coupling node. The second switching element 30 is changed to an off-state by the logic power supply abnormality being detected by the comparator 22 for a logic power supply and by the detection signal Lcmp being set to be at a high level. In case that the detection signal Lcmp is set to be at a high level, the second switching element 30 maintains an on-state.

Figure 7:
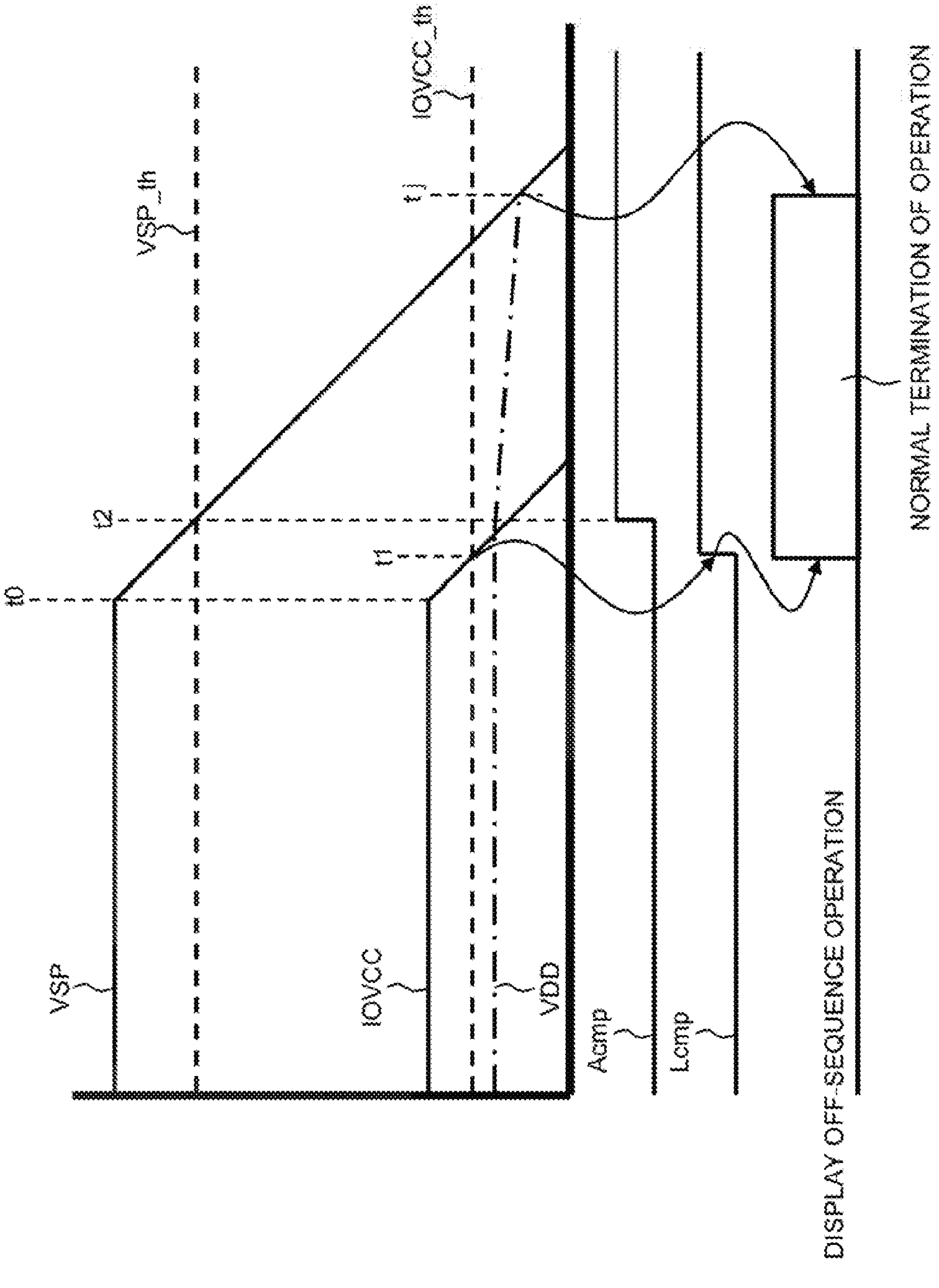
FIG. 7 is a timing diagram illustrating transition waveforms of power supply voltages and a display off-sequence operation during the generation of abnormality by which an external analog power supply voltage and an external logic power supply voltage are cut off substantially simultaneously.
Figure 8:
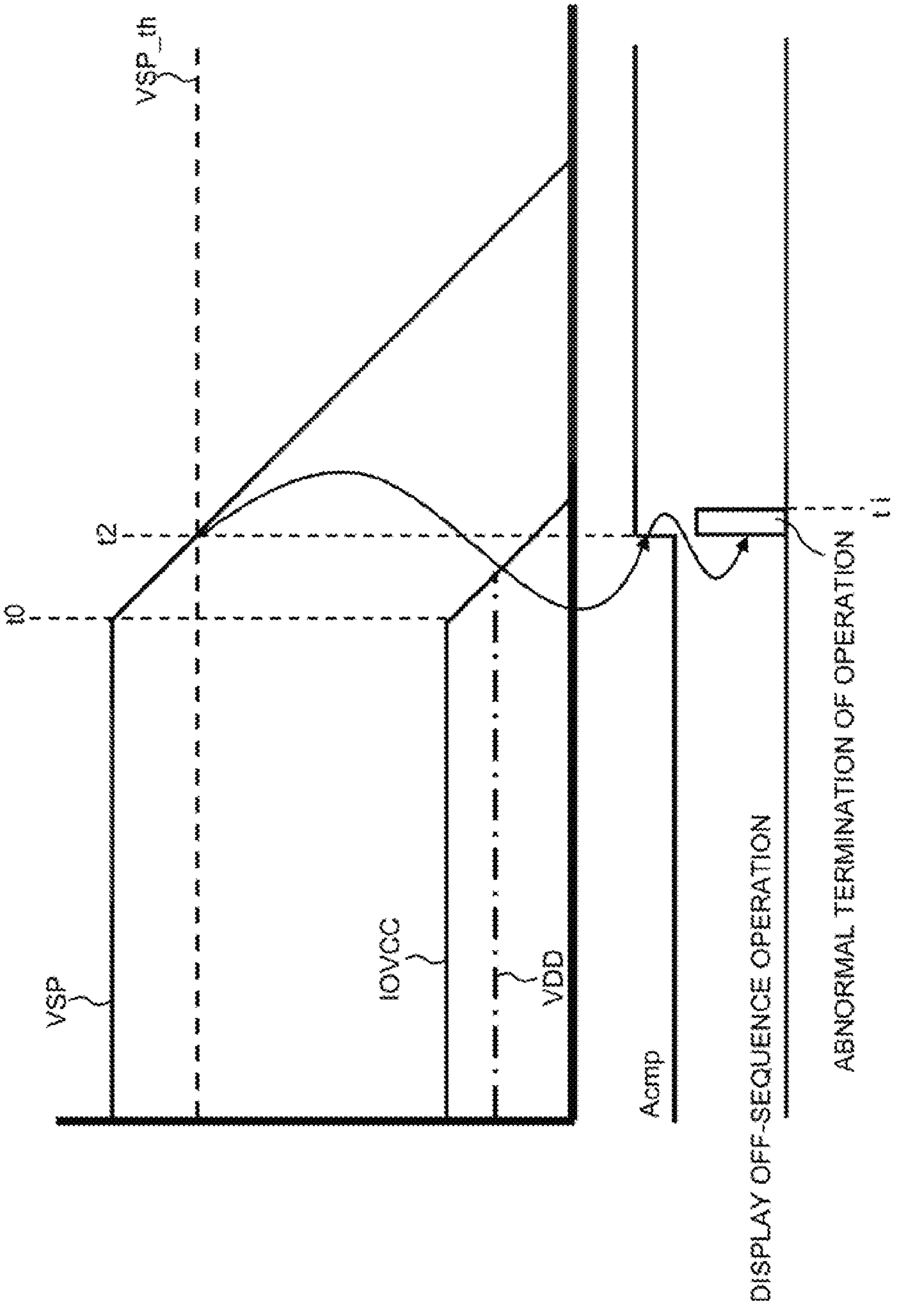
FIG. 8 is a timing diagram illustrating transition waveforms of power supply voltages and a display off-sequence operation in case that a countermeasure for a drop delay in an internal logic power supply voltage is not taken at all during the generation of abnormality by which the external analog power supply voltage and the external logic power supply voltage are cut off substantially simultaneously.
Figure 9:
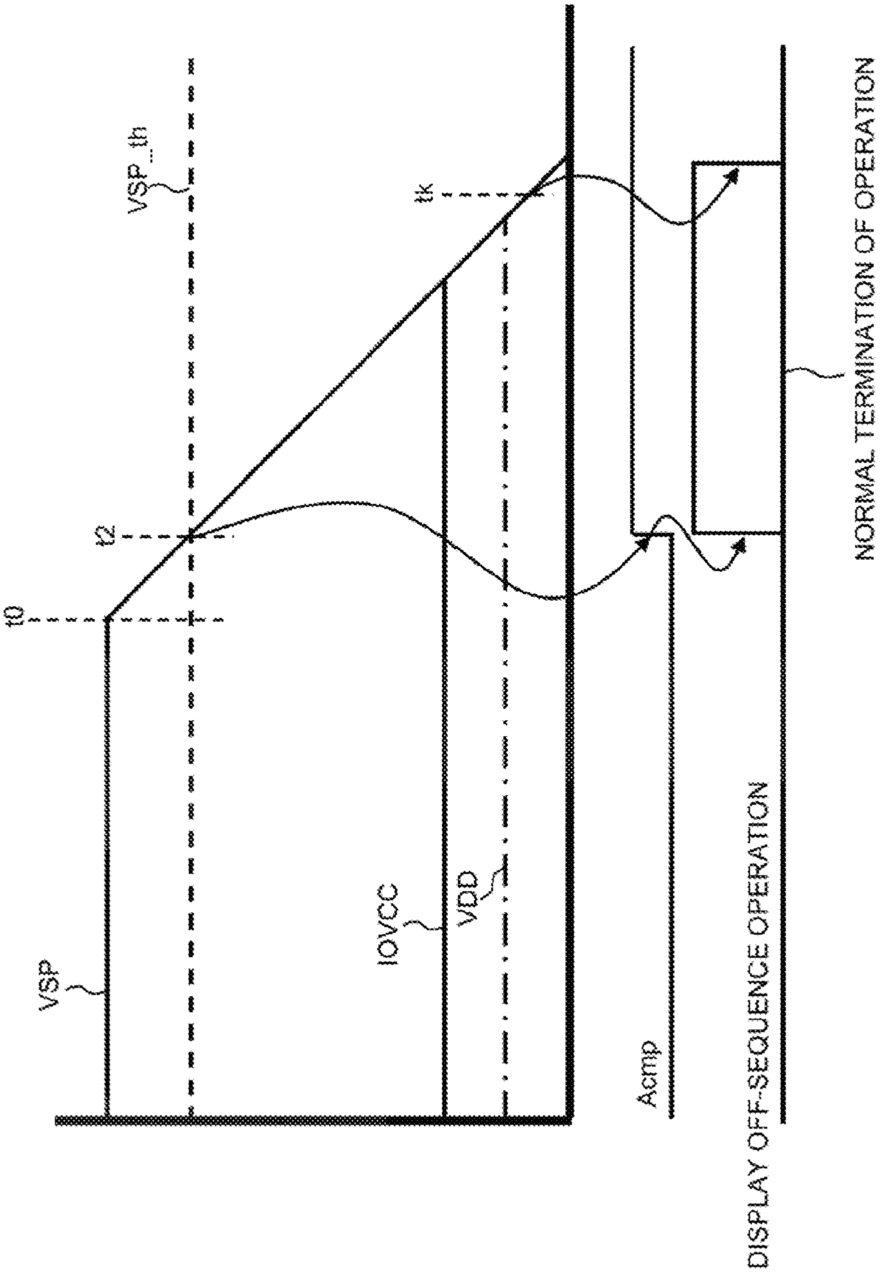
FIG. 9 is a timing diagram illustrating transition waveforms of power supply voltages and a display off-sequence operation in case that a drop in external logic power supply voltage is considerably delayed as compared to a drop in external analog power supply voltage during the generation of abnormality by which the external analog power supply voltage and the external logic power supply voltage are cut off.

FIG. 7 illustrates a display off-sequence operation and transition waveforms of power supply voltages during the generation of abnormality by which the external analog power supply voltage VSP and the external logic power supply voltage IOVC are cut off substantially simultaneously. An assumption is made of the generation of abnormality by which the external analog power supply voltage VSP and the external logic power supply voltage IOVCC are cut off substantially simultaneously due to the dropout or the like of the battery power supply 4 at time t0. In this case, the external logic power supply abnormality is detected in advance at time t1 by the hysteresis comparator 22_*a* for a logic power supply. Thereafter, the external analog power supply abnormality is detected at time t2 by the hysteresis comparator 23_*a* for an analog power supply. Since the external analog power supply voltage VSP is higher than the external logic power supply voltage VSP, a potential difference until the external logic power supply voltage IOVCC reaches voltage IOVCC_th at time t1 is smaller than a potential difference until the external analog power supply voltage VSP reaches voltage VSP_th at time t2, it is assumed, for convenience, that the external logic power supply abnormality is detected in advance. Considering a power supply load or the like, the contrary is naturally present. In case that either the logic power supply detection circuit 22 detects the external logic power supply abnormality or the analog power supply detection circuit 23 detects the external analog power supply abnormality is detected, the display off-sequence circuit 11 is instructed to start the display off-sequence through the OR circuit 24 in response to either previous detection. In the invention, the order does not have a substantial meaning. The invention is of significance in that, in case that the external logic power supply abnormality is detected by the logic power supply detection circuit 22, the auxiliary amplifier 21 functions to make up for a drop in the internal logic power supply voltage VDD output by the main amplifier 20, and an attenuation in the reference voltage VRdiv of the auxiliary amplifier 21 is mitigated by the sample and hold circuit SH1 of the auxiliary amplifier 21 being set to be in a hold state to thereby maintain an output operation of 1.2 V as long as possible. Therefore, as illustrated in FIG. 7, it is possible to complete the display off-sequence operation until time tj at which the operation guarantee voltage of the internal logic power supply voltage VDD is maintained. Particularly, in the present embodiment, the sample and hold circuit SH2 of the main amplifier 20 is set to be in a hold state in synchronization with the sample and hold circuit SH1 of the auxiliary amplifier 21 being set to be in a hold state. Thereby, even in case that the reference voltage generation circuit 10 is influenced by the external logic power supply voltage IOVCC being cut off, the reference voltage Vref which is supplied to the main amplifier 20 is held by the second sample and hold circuit SH2, and thus it is possible to obtain a margin for time until the attenuation, and to realize a function of maintaining the output of the main amplifier 20 some extent. This function and the output function of the auxiliary amplifier 21 further increase the certainty of display off-sequence completion by the display off-sequence circuit 11 during the undesired cutoff of a power supply. In case that it is assumed that the auxiliary amplifier 21 or the sample and hold circuit SH1 is not caused to function by detecting the external logic power supply abnormality, the generation of the external logic power supply abnormality (t0) causes the display off-sequence to be started in response to the external analog power supply abnormality (t2) as illustrated in FIG. 8. An undesired drop in the internal logic power supply voltage VDD is not able to be mitigated even in case that the external logic power supply voltage IOVCC drops in the meantime, and thus the internal logic power supply voltage VDD is set to the operation guarantee voltage or lower before the display off-sequence is completed (ti). In case that it is assumed that a very large power supply stabilization capacitor is externally attached to the input terminal of the external logic power supply voltage to thereby considerably delay a drop in the external logic power supply voltage, as illustrated in FIG. 9, it is possible to complete the display off-sequence operation until time tk at which the operation guarantee voltage of the internal logic power supply voltage VDD is maintained. However, a countermeasure using the very large external capacitor may be less desired.

As described above, while the invention devised by the inventor has been described specifically based on the embodiments thereof, the invention is not limited to the embodiments, and it goes without saying that various changes and modifications may be made without departing from the scope thereof.

For example, the display panel to be driven for display by the display driver which is an example of a semiconductor device according to the invention is not limited to a liquid crystal display panel, and may be other display panels such as an electroluminescent panel. The driven device to be driven by the semiconductor device according to the invention is not limited to the display panel, and may be, for example, apparatuses required to be stopped at a startup position during a stop as in a spindle such as a motor, or other circuit devices required to return a circuit state during a stop to an initial state.

Other circuit modules may be mixed with the semiconductor device. In a case of a semiconductor device which is used for drive control of a display panel having a touch panel formed thereon so as to overlap the surface, a touch controller that performs touch detection control of the touch panel and a local processor that performs a coordinate arithmetic operation or the like of a touch position can also be mixed with each other, in addition to the display driver.

The circuit that detects the external analog power supply abnormality or the external logic power supply abnormality is not limited to the hysteresis comparator, and can be appropriately changed. The configurations of the auxiliary amplifier and the main amplifier are not also limited to a voltage follower amplifier, and can be appropriately changed to those of a non-inverting differential amplifier, an inverting differential amplifier and the like.

The external detection target of the analog power supply abnormality may be a negative voltage such as a VPN.

What is claimed is:

1. A semiconductor device comprising:

a power supply circuit configured to generate a first internal power supply voltage using a first external power supply voltage and generate a second internal power supply voltage using a second external power supply voltage higher than the first external power supply voltage in terms of an absolute value;

an internal circuit configured to drive and control an external driven device, wherein the internal circuit is configured to use the first internal power supply voltage and the second internal power supply voltage as operation power supplies; and an initialization sequence circuit configured to use the first internal power supply voltage as a first operation power supply and initialize a state of the external driven device, wherein the power supply circuit includes:

a detection circuit configured to initialize the initialization sequence circuit after detecting at least one of: the first external power supply voltage is abnormally cut off and the second external power supply voltage is abnormally cut off, an auxiliary amplifier configured to make up for a drop in the first internal power supply voltage, using the second external power supply voltage as a second operation power supply, after the first external power supply voltage is cut off abnormally, and a sample and hold circuit of a first reference voltage, connected to an input of the auxiliary amplifier, wherein the sample and hold circuit is configured to specify an output voltage of the auxiliary amplifier, and wherein the sample and hold circuit is configured in a hold state after detecting the first external power supply voltage is cut off abnormally.

2. The semiconductor device according to claim 1, wherein the output voltage of the auxiliary amplifier is a voltage which is (i) lower than an expected voltage value of the first internal power supply voltage by an undesired maximum drop voltage or higher and (ii) is higher than an operation guaranteed minimum voltage.

3. The semiconductor device according to claim 2, wherein the power supply circuit includes a reference voltage generation circuit that generates a second reference voltage using the first external power supply voltage as a third operation power supply, a voltage-dividing circuit that divides the second reference voltage generated in the reference voltage generation circuit, and a main amplifier that generates the first internal power supply voltage using the first external power supply voltage as the third operation power supply, the divided voltage which is output from the voltage-dividing circuit is set to a third reference voltage of the auxiliary amplifier, and the second reference voltage is set to a reference potential of the main amplifier.

4. The semiconductor device according to claim 3, wherein the main amplifier includes a first operational amplifier that receives the second reference voltage as the reference potential in one input terminal and receives a first feedback voltage from an output of the first operational amplifier in the other input terminal.

5. The semiconductor device according to claim 4, wherein the auxiliary amplifier includes a second operational amplifier that receives the divided voltage in one input terminal and receives a second feedback voltage from the output of the second operational amplifier in the other input terminal.

6. The semiconductor device according to claim 3, wherein the sample and hold circuit comprises a capacitive element coupled to an input terminal of the third reference voltage of the auxiliary amplifier and a first switching element capable of selectively supplying the divided voltage to a coupling node of the capacitive element, wherein the detection circuit changes the first switching element to an off-state after detecting the first external power supply voltage is cut off abnormally.

7. The semiconductor device according to claim 3, wherein the power supply circuit includes a different sample and hold circuit including a capacitive element coupled to an input terminal of the second reference voltage of the main amplifier and a switching element capable of selectively supplying the second reference voltage to a coupling node of the capacitive element, and the detection circuit changes the switching element to an off-after detecting the first external power supply voltage is cut off abnormally.

8. The semiconductor device according to claim 1, wherein the detection circuit includes a first detection circuit that detects when the first external power supply voltage is cut off abnormally, the first detection circuit includes a first comparator that inputs the first reference voltage to one input terminal and inputs a first divided voltage of the first external power supply voltage to the other input terminal, using the first external power supply voltage as a third operation power supply, and a first output circuit that forms an output according to an output of the first comparator, using the first internal power supply voltage as the first operation power supply, and wherein the first divided voltage before the first external power supply voltage is cut off abnormally is greater than the reference voltage.

9. The semiconductor device according to claim 8, wherein the detection circuit includes a second detection circuit that detects when the second external power supply voltage is cut off abnormally, the second detection circuit includes a second comparator that inputs the reference voltage to one input terminal and inputs a second divided voltage of the second external power supply voltage to the other input terminal, using the second external power supply voltage as the second operation power supply, and a second output circuit that forms an output according to an output of the second comparator, using the first internal power supply voltage as the first operation power supply, and wherein the second divided voltage before the second external power supply voltage is cut off abnormally is greater than the reference voltage.

10. An electronic apparatus comprising:

a host device;

a drive device which is controlled by the host device;

a driven device which is driven by the drive device; and a battery power supply unit, wherein the drive device comprises:

a power supply circuit configured to receive a first external power supply voltage and a second external power supply voltage higher than the first external power supply voltage in terms of an absolute value from the battery power supply unit, generate a first internal power supply voltage using a first external voltage, and generate a second internal power supply voltage using the second external power supply voltage, an internal circuit configured to drive and control the driven device, using the first internal power supply voltage and the second internal power supply voltage as operation power supplies, and an initialization sequence circuit configured to use the first internal power supply voltage as a first operation power supply and initialize a state of the driven device, wherein the power supply circuit comprises:

a detection circuit configured to initialize the initialization sequence circuit after detecting at least one of: the first external power supply voltage is cut off abnormally and the second external power supply voltage is cut off abnormally, an auxiliary amplifier configured to make up for a drop in the first internal power supply voltage, using the second external power supply voltage as a second operation power supply, after the first external power supply voltage is cut off abnormally, and a sample and hold circuit of a first reference voltage, connected to an input of the auxiliary amplifier, wherein the sample and hold circuit is configured to specify an output voltage of the auxiliary amplifier, and wherein the sample and hold circuit is configured in a hold state after detecting the first external power supply voltage is cut off abnormally.

11. The electronic apparatus according to claim 10, wherein the output voltage of the auxiliary amplifier is a voltage which is (i) lower than an expected voltage value of the first internal power supply voltage by an undesired maximum drop voltage or higher and (ii) is higher than an operation guaranteed minimum voltage.

12. The electronic apparatus according to claim 11, wherein the power supply circuit includes a reference voltage generation circuit that generates a second reference voltage using the first external power supply voltage as a third operation power supply, a voltage-dividing circuit that divides the second reference voltage generated in the reference voltage generation circuit, and a main amplifier that generates the first internal power supply voltage using the first external power supply voltage as the third operation power supply, the divided voltage which is output from the voltage-dividing circuit is set to a third reference voltage of the auxiliary amplifier, and the second reference voltage is set to a reference potential of the main amplifier.

13. The electronic apparatus according to claim 12, wherein the sample and hold circuit comprises a capacitive element coupled to an input terminal of the third reference voltage of the auxiliary amplifier and a switching element capable of selectively supplying the divided voltage to a coupling node of the capacitive element, wherein the detection circuit changes the switching element to an off-state after detecting the first external power supply voltage is cut off abnormally.

14. The electronic apparatus according to claim 12, wherein the power supply circuit includes a different sample and hold circuit including a capacitive element coupled to an input terminal of the second reference voltage of the main amplifier and a switching element capable of selectively supplying the second reference voltage to a coupling node thereof, and the detection circuit changes the switching element to an off-state after detecting the first external power supply voltage is cut off abnormally.

15. The electronic apparatus according to claim 10, wherein the detection circuit includes a first detection circuit that detects when the first external power supply voltage is cut off abnormally, the first detection circuit includes a first comparator that inputs the first reference voltage to one input terminal and inputs a first divided voltage of the first external power supply voltage to the other input terminal, using the first external power supply voltage as a third operation power supply, and a first output circuit that forms an output according to an output of the first comparator, using the first internal power supply voltage as the first operation power supply, and the first divided voltage before the first external power supply voltage is cut off abnormally is greater than the reference voltage.

16. The electronic apparatus according to claim 15, wherein the detection circuit includes a second detection circuit that detects when the second external power supply voltage is cut off abnormally, the second detection circuit includes a second comparator that inputs the reference voltage to one input terminal and inputs a second divided voltage of the second external power supply voltage to the other input terminal, using the second external power supply voltage as the second operation power supply, and a second output circuit that forms an output according to an output of the second comparator, using the first internal power supply voltage as the first operation power supply, and the second divided voltage before the second external power supply voltage is cut off abnormally is greater than the reference voltage.

17. The electronic apparatus according to claim 10, wherein the driven device is a display panel in which a plurality of display elements are disposed in a matrix, and the initialization sequence circuit initializes signals which are held by the display elements of the display panel.

18. The electronic apparatus according to claim 17, wherein the display panel is a liquid crystal display panel, and the initialization sequence circuit extracts charges which are held by the display elements of the liquid crystal display panel to initialize the signals which are held by the display elements.

19. A device comprising:

a power supply circuit configured to generate a first internal power supply voltage using a first external power supply voltage and generate a second internal power supply voltage using a second external power supply voltage higher than the first external power supply voltage in terms of an absolute value;

an internal circuit configured to drive and control an external driven device using the first internal power supply voltage and the second internal power supply voltage; and an initialization sequence circuit configured to use the first internal power supply voltage as a first operation power supply and initialize a state of the external driven device, wherein the power supply circuit includes:

a detection circuit configured to initialize the initialization sequence circuit after detecting at least one of: the first external power supply voltage is abnormally cut off and the second external power supply voltage is abnormally cut off, an auxiliary amplifier configured to make up for a drop in the first internal power supply voltage, using the second external power supply voltage as a second operation power supply, after the first external power supply voltage is cut off abnormally, and a sample and hold circuit of a first reference voltage, connected to an input of the auxiliary amplifier, wherein the sample and hold circuit is configured in a hold state after detecting the first external power supply voltage is cut off abnormally.

20. The device of claim 19, wherein the power supply circuit includes a reference voltage generation circuit that generates a second reference voltage using the first external power supply voltage as a third operation power supply, a voltage-dividing circuit that divides the second reference voltage generated in the reference voltage generation circuit, and a main amplifier that generates the first internal power supply voltage using the first external power supply voltage as the third operation power supply, the divided voltage which is output from the voltage-dividing circuit is set to a third reference voltage of the auxiliary amplifier, and the second reference voltage is set to a reference potential of the main amplifier.

* * * * *